United States Patent
Xiao et al.

(10) Patent No.: US 9,216,434 B2
(45) Date of Patent: Dec. 22, 2015

(54) LIGHT-HEAT DUAL CURING ANISOTROPIC CONDUCTIVE ADHESIVE, ANISOTROPIC CONDUCTIVE FILM AND PREPARATION METHODS THEREOF

(71) Applicant: SHENZHEN FISHER INDUSTRIAL CO., LTD, Guangdong (CN)

(72) Inventors: Ren-Liang Xiao, Guangdong (CN);
Chang-Hou Zhao, Guangdong (CN);
Cheng-Gui Liu, Guangdong (CN);
Xian-Fei Wan, Guangdong (CN);
Chang-Wu Yang, Guangdong (CN);
Hua-Guo Yin, Guangdong (CN)

(73) Assignee: SHENZHEN FISHER INDUSTRIAL CO., LTD., Guangdong (CN)

( * ) Notice: Subject to any disclaimer, the term of this patent is extended or adjusted under 35 U.S.C. 154(b) by 0 days.

(21) Appl. No.: 14/128,629

(22) PCT Filed: Apr. 24, 2013

(86) PCT No.: PCT/CN2013/074658
§ 371 (c)(1),
(2) Date: Dec. 23, 2013

(87) PCT Pub. No.: WO2013/170692
PCT Pub. Date: Nov. 21, 2013

(65) Prior Publication Data
US 2014/0193599 A1    Jul. 10, 2014

(30) Foreign Application Priority Data

May 17, 2012   (CN) .......................... 2012 1 0153970

(51) Int. Cl.
*B05D 3/06*      (2006.01)
*C09J 9/02*      (2006.01)
(Continued)

(52) U.S. Cl.
CPC ............... *B05D 3/067* (2013.01); *C09J 7/0242* (2013.01); *C09J 9/02* (2013.01); *C09J 11/00* (2013.01);
(Continued)

(58) Field of Classification Search
CPC .......... B05D 3/067; C09J 7/0242; C09J 9/02; C09J 11/04; C09J 163/00; C09J 175/14
See application file for complete search history.

(56) References Cited

U.S. PATENT DOCUMENTS 3,074,867 A * 1/1963 Shewmaker et al. ............. 522/5
3,896,076 A * 7/1975 Watanabe et al. ............. 523/440
(Continued)

FOREIGN PATENT DOCUMENTS

CN      101724361       *   6/2010
CN      101724361 A         6/2010
(Continued)

*Primary Examiner* — Elena T Lightfoot
(74) *Attorney, Agent, or Firm* — CKC & Partners Co., Ltd.

(57) ABSTRACT

Preparation methods of an anisotropic conductive adhesive film are provided. One of the preparation methods includes heating a solid-state light-curing resin, a solid-state thermosetting resin and a solid-state elastomer to form a mixture. A liquid-state light curing active monomer and plasticizer are added to the mixture. A leveling agent, antioxidant and insulating nanoparticles are added separately to the mixture. Conductive particles are added to the mixture. A light curing agent, latent heat curing agent and coupling agent are added to the mixture to produce a light-beat dual curing anisotropic conductive adhesive. The conductive adhesive is coated on a plastic film base material to form a semi-finished product. The semi-finished product is cured and dried to form a cured conductive adhesive layer, so that an anisotropic conductive adhesive film is produced. The anisotropic conductive adhesive layer is cut, and the anisotropic conductive adhesive film is rolled.

2 Claims, 4 Drawing Sheets (51) Int. Cl.
*C09J 163/00* (2006.01)
*C09J 175/14* (2006.01)
*C09J 7/02* (2006.01)
*C09J 11/00* (2006.01)
C09J 4/06 (2006.01)
C08K 3/08 (2006.01)
C08K 5/00 (2006.01)
C08K 7/18 (2006.01)
H01L 23/00 (2006.01)

(52) U.S. Cl.
CPC .............. *C09J 163/00* (2013.01); *C09J 175/14* (2013.01); *C08K 3/08* (2013.01); *C08K 5/0025* (2013.01); *C08K 7/18* (2013.01); *C08K 2003/0831* (2013.01); *C09J 4/06* (2013.01); *C09J 2203/326* (2013.01); *H01L 24/29* (2013.01); *H01L 2224/2929* (2013.01); *H01L 2224/29344* (2013.01); *H01L 2224/29386* (2013.01); *H01L 2924/07811* (2013.01); *Y10T 428/1471* (2015.01); *Y10T 428/2809* (2015.01)

(56) References Cited

U.S. PATENT DOCUMENTS

| | | | | |
|---|---|---|---|---|
| 6,077,879 | A | * | 6/2000 | Ohtsuki et al. ................. 522/101 |
| 6,543,130 | B1 | * | 4/2003 | Wittmaier ........................ 29/846 |
| 2009/0140210 | A1 | * | 6/2009 | Toshioka et al. ............... 252/500 |
| 2010/0184880 | A1 | * | 7/2010 | Fukui ............................... 522/20 |

FOREIGN PATENT DOCUMENTS

| | | |
|---|---|---|
| CN | 102127386 A | 7/2011 |
| JP | 2002302662 A | 10/2002 |
| JP | 2005123025 A | 5/2005 |

* cited by examiner

LIGHT-HEAT DUAL CURING ANISOTROPIC CONDUCTIVE ADHESIVE, ANISOTROPIC CONDUCTIVE FILM AND PREPARATION METHODS THEREOF

CROSS-REFERENCE TO RELATED APPLICATION

This application is a continuation of international application No. PCT/CN2013/074658, filed on Apr. 24, 2013 which claims priority to Chinese Patent Application Serial No. 201210153970.6 filed on May 17, 2012.

FIELD OF THE PRESENT INVENTION

The present invention relates to micro-electronic packaging technology field, in particular to a kind of light-heat dual curing anisotropic conductive adhesive, anisotropic conductive film and their preparation methods.

BACKGROUND OF THE PRESENT INVENTION

Anisotropic conductive film (ACF) has both unilateral conduction function and adhesion function. Currently, ACF is used for COG, TCP/COF, COB and FPC, in particular for the electric connection between IC and ITO glass. It can connect a lot of minuscule wires which traditional connectors can not connect.

Anisotropic conductive films are mainly applied to the products such as mobile handhelds, cell phones, digital cameras, computers, printers, keyboards, consumer electronics, TVs, GPS products, electronic dictionaries and so on.

Traditional ACF consists of thermosetting resin, conducting particles, curing agent, plasticizer and so on. When producing ACF, firstly, we dissolve the above-mentioned components in toluene, butanone or other volatile solvents to make a lot of anisotropic conductive adhesive (ACA). Secondly, we coat the above-mentioned ACA on a plastic film, then blow plenty of hot air to dry the ACA. Then the above-mentioned solvent is removed, and the ACF is produced. Then we cut the ACF to make up anisotropic conductive adhesive film (ACF). During the course of production, plenty of polluted harmful waste gas will affect the health of the workers.

The Chinese patent CN1926675A and the Chinese patent CN1367219A both disclose a kind of light curing anisotropic conductive adhesive (ACA) or light curing anisotropic conductive film (ACF). Those patents use light curing technology when using some ACF to connect some electric components. The ACA only can be used to connect transparent electrode (for example ITO glass), but can not be used to connect non-transparent electrode (for example plasma panel ADD etc). The Chinese patent CN 101724361 discloses the method about using heat curing to promote light curing, but it does not apply light curing technology to produce ACF. The adhesion strength of light curing is not as good as heat curing. In recent years, in micro-electronic packaging technology field, the connecting technology between those electronic components such as PCB terminals and IC chips develops to be integrated, high-performance, multi-lead, and of narrow space length. The requirements about the performance of the ACF is more and more high. Light curing can not meet the requirements about high bond strength.

SUMMARY OF THE PRESENT INVENTION

The technical problem to be solved by the present invention is to overcome serious environmental pollution due to using solvent during the course of producing ACF under the traditional technology. The present invention applies light-heat dual curing technology to produce ACF. Applying light curing method to producing ACF can avoid using solvent to protect the natural environment. Applying heat curing method for electric connection can get high adhesion strength between the electric components.

In order to solve the technical problem, the present invention puts forward the following technical solution: a kind of light-heat dual curing anisotropic conductive adhesive includes: light curing activated monomer 15.0-18.0%, light-cured resin 4.5-12.5%, thermosetting resin 20.0-25.0%, elastomer 5.0-10.0%, insulating nanoparticles 8.0-15.0%, conductive particles 4.0-18.0%, light curing agent 3.0-5.0% and latent heat curing agent 12.0-16.0%, wherein the above-mentioned components are counted according to weight percentage.

The further improvement of the technical solution is: the conductive adhesive furtherly includes plasticizer whose weight percentage is 3.0-6.0%.

The further improvement of the technical solution is: the conductive adhesive furtherly includes coupling agent whose weight percentage is 0.5-1.0%.

The further improvement of the technical solution is: the conductive adhesive furtherly includes leveling agent whose weight percentage is 0.5-1.5%.

The further improvement of the technical solution is: the conductive adhesive furtherly includes antioxidant whose weight percentage is 0.5-1.0%.

In order to solve the technical problem, the present invention puts forward the following technical solution: a kind of light-heat dual curing anisotropic conductive film comprising a plastic film basic material and a conductive adhesive layer, and a kind of light-heat dual curing anisotropic conductive adhesive being coated on the plastic film basic material and then being cured with ultraviolet light to form said conductive adhesive layer;

Said light-heat dual curing anisotropic conductive adhesive consisting of light curing activated monomer 15.0-18.0%, light-cured resin 4.5-12.5%, thermosetting resin 20.0-25.0%, elastomer 5.0-10.0%, plasticizer 3.0-6.0%, insulating nanoparticles 8.0-15.0%, conductive particles 4.0-18.0%, light curing agent 3.0-5.0%, latent heat curing agent 12.0-16.0%, coupling agent 0.5-1.0%, leveling agent 0.5-1.5% and antioxidant 0.5-1.0%, wherein the above-mentioned components are counted according to weight percentage.

The further improvement of the technical solution is: the conductive film furtherly comprises a protective film that is covered on the conductive adhesive layer.

The further improvement of the technical solution is: the material of the above-mentioned plastic film basic material is polyethylene terephthalate.

The further improvement of the technical solution is: the material of the above-mentioned plastic film basic material is polyethylene terephthalate.

In order to solve the technical problem, the present invention puts forward the following technical solution: a kind of preparation method of the light-heat dual curing anisotropic conductive film comprises:

Step one, weigh light curing activated monomer 15.0-18.0%, light-cured resin 4.5-12.5%, thermosetting resin 20.0-25.0%, elastomer 5.0-10.0%, plasticizer 3.0-6.0%, insulating nanoparticles 8.0-15.0%, conductive particles 4.0-18.0%, light curing agent 3.0-5.0%, latent heat curing agent 12.0-16.0%, coupling agent 0.5-1.0%, leveling agent 0.5-

1.5% and antioxidant 0.5-1.0%, wherein the above-mentioned components are counted according to weight percentage;

Step two, put the solid-state light-cured resin, thermosetting resin and elastomer in a dispersing mixer, then heat them to melt to form a mixture, wherein the inciting temperature is between 130° C. to 150° C.;

Step three, put the liquid-state light curing activated monomer and plasticizer in the above-mentioned mixture, wherein the temperature is below 80° C.;

Step four, put the leveling agent, antioxidant and insulating nanoparticles in the above-mentioned mixture one by one;

Step five, put the conductive particles in the above-mentioned mixture;

Step six, put the light curing agent, latent heat curing agent and coupling agent in the above mixture, so that a light-heat dual curing anisotropic conductive adhesive is produced;

Step seven, coat the above-mentioned conductive adhesive on a plastic film basic material with a coating machine;

step eight, the semi-finished product which is gotten in step seven is cured and is dried with a UV curing machine to form a conductive adhesive layer, so that a light-heat dual curing anisotropic conductive film is produced;

Step nine, the semi-finished product which is gotten in step eight is cut roughly and carefully with a slitting machine and is rolled to get a kind of anisotropic conductive adhesive film.

In order to solve the technical problem, the present invention puts forward the following technical solution: a kind of preparation method of the light-heat dual curing anisotropic conductive film comprises:

Step one, weigh light curing activated monomer 15.0-18.0%, light-cured resin 4.5-12.5%, thermosetting resin 20.0-25.0%, elastomer 5.0-10.0%, plasticizer 3.0-6.0%, insulating nanoparticles 8.0-15.0%, conductive particles 4.0-18.0%, light curing agent 3.0-5.0%, latent heat curing agent 12.0-16.0%, coupling agent 0.5-1.0%, leveling agent 0.5-1.5% and antioxidant 0.5-1.0%, wherein the above-mentioned components are counted according to weight percentage;

Step two, put the solid-state light-cured resin, thermosetting resin and elastomer in a dispersing mixer, then heat them to melt to form a mixture, wherein the melting temperature is between 130° C. to 150° C.;

Step three, put the liquid-state light curing activated monomer and plasticizer in the above-mentioned mixture, wherein the temperature is below 80° C.;

Step four, put the leveling agent, antioxidant and insulating nanoparticles in the above-mentioned mixture one by one;

Step five, put the conductive particles in the above-mentioned mixture;

Step six, put the light curing agent, latent heat curing agent and coupling agent in the above mixture, so that a light-heat dual curing anisotropic conductive adhesive is produced;

Step seven, coat the above-mentioned conductive adhesive on a plastic film basic material with a coating machine;

Step eight, the semi-finished product which is gotten in step seven is cured and is dried with a UV curing machine to form a conductive adhesive layer, so that a light-heat dual curing anisotropic conductive film is produced;

Step nine, a protective film is covered on the conductive adhesive layer, so that a light-heat dual curing anisotropic conductive film is produced;

Step ten, the semi-finished product which is gotten in step nine is cut roughly and carefully with a slitting machine and is rolled to get a kind of anisotropic conductive adhesive film.

The present invention has many advantages than prior arts. Ultraviolet light curing method is applied to produce ACF can avoid using solvent to protect the natural environment. When using ACF, heat curing method is then applied to get high adhesion strength.

DESCRIPTION OF THE PREFERRED EMBODIMENT

The present invention discloses a kind of light-beat dual curing anisotropic conductive adhesive. The anisotropic conductive adhesive consists of the following components, which are counted according to weight percentage:
light curing activated monomer 15.0-18.0%;
light-cured resin 4.5-12.5%;
thermosetting resin 20.0-25.0%;
elastomer 5.0-10.0%;
plasticizer 3.0-6.0%;
insulating nanoparticles 8.0-15.0%;
conductive particles 4.0-18.0%
light curing agent 3.0-5.0%
latent heat curing agent 12.0-16.0%;
coupling agent 0.5-1.0%
leveling agent 0.5-1.5%; and
antioxidant 0.5-1.0%.

The above-mentioned light curing agent and latent heat curing agent both are a kind of free-radical type curing agent, or a kind of ionic type curing agent, or a kind of latent curing agent that is the mixture of a kind of free-radical type curing agent and a kind of ionic type curing agent.

The above-mentioned light curing activated monomer consists of a kind of the following substance or at least two kinds of the following substances: hydroxyethyl methylacrylate; hydroxypropyl methyl acrylate; isopropyl methacrylate ester; ethoxy ethoxy acrylate; lauryl acid methacrylate; ethylene glycol phenyl ether acrylate; 2-dimethyl propyl ester two acrylate; tricyclic decane two methanol two acrylate; ethylene oxide bisphenol A two acrylic ester; 2-methyl-1,3 propylene glycol two acrylate; 2 (3) propylene glycol acrylate; three (2-hydroxyethyl) isocyanurate three acrylate; ethylene oxide (propylene oxide) three hydroxy methyl propane three acrylate; propoxylated glyceryl triacrylate; two-four three trimethylolpropane acrylate; (b) oxide pentaerythritol tour acrylate; dipentaerythritol pentaacrylate; dipentaerythritol hexaacrylate.

The above-mentioned light-cured resin consists of a kind of the following substance or at least two kinds of the following substances: unsaturated polyester; epoxy-acrylic resin; polyurethane acrylic resin; polyester acrylic resin; polyether acrylic resin; acrylate functionalized polyacrylic resin; polyolefin resin containing unsaturated double bond; all kinds of epoxy resins; epoxy functionalized polysiloxane resin; resin with vinyl ether functional group.

The above-mentioned light curing agent consists of a kind of the following substance or at least two kinds of the following substances: benzoin ether derivatives, benzil derivatives, two alkoxy acetophenone, alpha hydroxy alkyl benzene ketone, alpha amine alkyl benzene ketone, acyl phosphine oxide, aryl peroxy ester compounds, benzoylformic acid ester, benzophenone, tertiary amine, thioxanthone, tertiary amine, anthraquinone, tertiary amine, diphenyliodonium salt.

The above-mentioned thermosetting resin consists of a kind of the following substance or at least two kinds of the following substances: glycidyl ether type epoxy resin, glycidyl ester type epoxy resin, glycidyl amine type epoxy resin, cycloaliphatic epoxy resin, linear aliphatic epoxy compound.

The above-mentioned latent heat curing agent consists of a kind of the following substance or at least two kinds of the following substances: dicyandiamide, 1-benzyl-2-2 imidazole, 2 mi-AER331 epoxy adduct, microcapsule-type curing agent, BF3MEA\2MZ-AZINE, double cyano malonitrile, diallyl melamine, Poly (piperidine kwai diacid) hydrazide, boron trifluoride benzyl amine complex compound.

The above-mentioned elastomer consists of a kind of the following substance or at least two kinds of the following substances: epoxy-terminated nitrile rubber, polyurethane rubber, hydroxyl-terminated liquid NBR, hydroxyl nitrile rubber hydroxyl-terminated polybutadiene, thiokol, acrylic rubber.

The above-mentioned conductive particles consist of a kind of the following substances: the composite conductive particles, which are prepared by the means that the surfaces of polymer microspheres are coated with copper, nickel, gold, silver, tin, zinc, iron, tungsten, or molybdenum.

The above-mentioned insulating nanoparticles consist of a kind of the following substance or at least two kinds of the following substances: nano-ceramic powder, nano-SiO2, nano-TiO2, nanometer calcium carbonate.

The above-mentioned plasticizer consists of a kind of the following substance or at least two kinds of the following substances: phthalates (including phthalate, terephthalate, and isophthalate), aliphatic dibasic acid esters (including adipate, azelate, and sebate), phosphate (including aliphatic alcohol phosphate, phenol phosphate, and chlorine phosphate), polyol ester (including glycerol triacetate, diethylene glycol benzoate and so on), benzene polycarboxylic acid esters including trioctyl trimellitate, trihexyl trimellitate, and tetraoctyl pyromellitate), citric easters (including triethyl citrate, acetyl triethyl citrate, tributyl citrate, acetyl citrate (2-ethyl ester and so on), polyester (including Poly(1,2-propylene glycol adipate), propanediol sebacate polyester, phthalic polyester and so on), epoxy plasticizer (including epoxidized soybean oil, epoxy flaxseed oil, butyl epoxy stearate, octyl epoxy stearate, epoxy triglyceride, di(2-Ethylhexyl)-4,5-epoxytetrahydroplithalate and so on), chlorine plasticizer (including chlorinated paraffin, methylpentachlorostearate), reactive plasticizer (including dibutyl maleate, dioctyl maleate, acrylic polyol ester, methyl acrylic polyol ester, fumarate, itaconate, unsaturated polyester resin and so on).

The above-mentioned leveling agent consists of to kind of the following substance or at least two kinds of the following substances: polydimethyl siloxane and polymethyl phenyl siloxane.

The above-mentioned coupling agent consists of a kind of the following substance or at least two kinds of the following substances: trimethoxy[2-(7-oxabicyclo[4.1.0]hept-3-yl) ethyl]-silane, γ-(glycidoxypropyl)trimethoxy silane, γ-methacryloxy propyl trimethoxy silane.

The above-mentioned antioxidant consists of a kind of the following substance or at least two kinds of the following substances: aromatic amine antioxidants, hindered phenol antioxidant, secondary antioxidant.

A kind of preparation method of the above-mentioned light-heat dual curing anisotropic conductive adhesive includes the following steps:

Step one: weigh light curing activated monomer 15.0-18.0%, light-cured resin 4.5-12.5%, light curing agent 3.0-5.0%, thermosetting resin 20.0-25.0%, latent heat curing agent 12.0-16.0%, elastomer 5.0-10.0%, plasticizer 3.0-6.0%, conductive particles 4.0-18.0%, insulating nanoparticles 8.0-15.0%, coupling agent 0.5-1.0%, leveling agent 0.5-1.5%; antioxidant 0.5-1.0%, and the above-mentioned components are counted according to weight percentage;

Step two: put the solid-state light-cured resin, thermosetting resin and elastomer in a dispersing mixer, then heat them to melt to form a mixture, and the melting temperature is between 130° C. to 1.50° C.;

Step three: put the liquid-state light curing activated monomer and plasticizer in the above-mentioned mixture, and the temperature is below 80° C.;

Step four: put the leveling agent, antioxidant and insulating nanoparticles in the above-mentioned mixture one by one;

Step five: put the conductive particles in the above-mentioned mixture;

Step six: put the light curing agent, latent heat curing agent and coupling agent in the above mixture, then the light-heat dual curing anisotropic conductive adhesive is produced.

Figure 1:
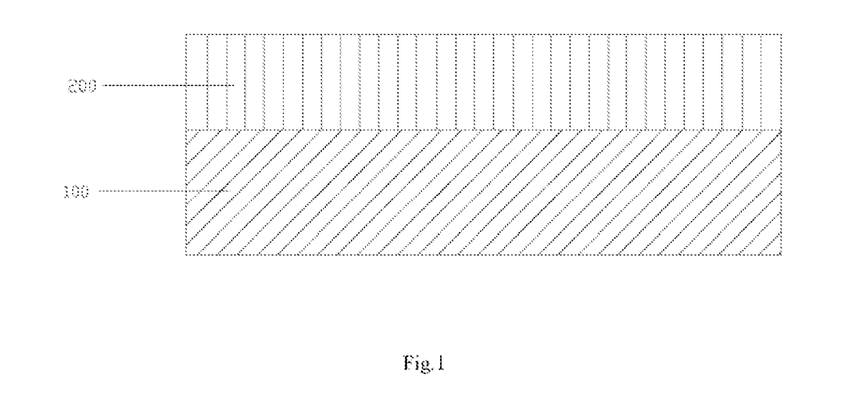
FIG. 1 is a sectional view of the first kind of light-heat dual curing anisotropic conductive film in accordance with the present invention.
Figure 3:
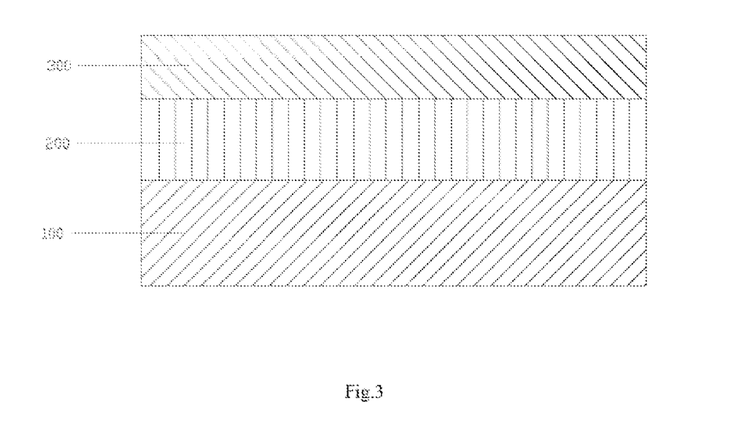
FIG. 3 is a sectional view of the second kind of light-heat dual curing anisotropic conductive film in accordance with the present invention.

As shown in FIG. 1 and FIG. 3, the present invention also discloses two kinds of light-heat dual curing anisotropic conductive films.

As shown in FIG. 1, the first kind of light-heat dual curing anisotropic conductive film comprises a plastic film basic material 100 and a conductive adhesive layer 200. The above-mentioned light-heat dual curing anisotropic conductive adhesive is coated on the plastic film basic material 100 and then is cured with ultraviolet light to form the above-mentioned conductive adhesive layer 200.

The material of the above-mentioned plastic film basic material 100 is PET (polyethylene terephthalate).

Figure 2:
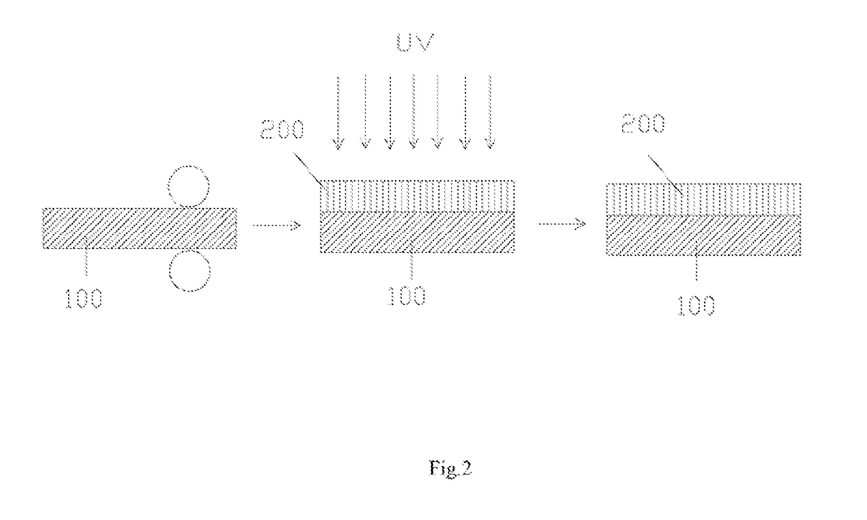
FIG. 2 is a diagrammatic view of the preparation method of the first kind of light-heat dual curing anisotropic conductive film in accordance with the present invention.

As shown in FIG. 2, a kind of preparation method of the above-mentioned first kind of light-heat dual curing anisotropic conductive film includes the following steps:

Step one: prepare the above-mentioned light-heat dual curing anisotropic conductive adhesive according to the above-mentioned preparation method;

Step two: coat the above-mentioned conductive adhesive on the plastic film basic material 100 with a coating machine:

Step three: the semi-finished product which is gotten in step two is cured and is dried with a UV curing machine to form a conductive adhesive layer 200, then a kind of light-heat dual curing anisotropic conductive film is produced in accordance with the present invention;

Step four: the semi-finished product which is gotten in step three is cut roughly and carefully with a slitting machine and is rolled to get a kind of anisotropic conductive adhesive film (ACF).

As shown in FIG. 3, the second kind of light-heat dual curing anisotropic conductive film comprises a plastic film basic material 100, a conductive adhesive layer 200 and a protective film 300. The above-mentioned light-heat dual curing anisotropic conductive adhesive is coated on the plastic film basic material 100 and then is cured with ultraviolet light to form the above-mentioned conductive adhesive layer 200.

The material of the above-mentioned plastic film basic material 100 is PET (polyethylene terephthalate).

Figure 4:
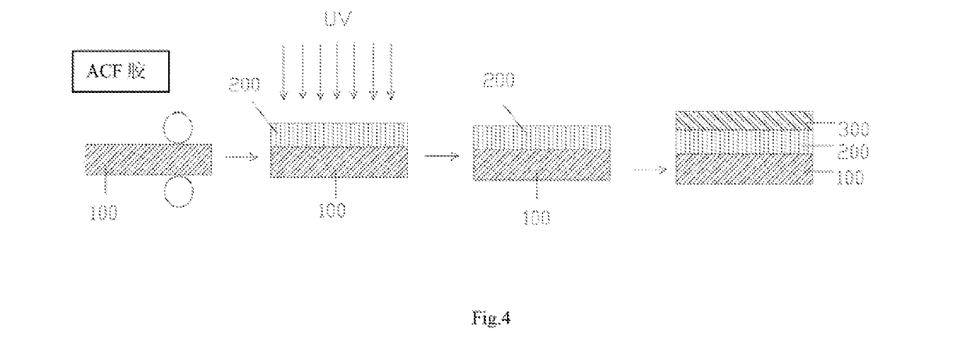
FIG. 4 is a diagrammatic view of the preparation method of the second kind of light-heat dual curing anisotropic conductive film in accordance with the present invention.

As shown in FIG. 4, a kind of preparation method of the above-mentioned second kind of light-heat dual curing anisotropic conductive film includes the following steps:

Step one: prepare the above-mentioned light-heat dual curing anisotropic conductive adhesive according to the above-mentioned preparation method;

Step two: defoam the above-mentioned conductive adhesive, and then coat the above-mentioned conductive adhesive on the plastic film basic material 100 with a coating machine;

Step three: the semi-finished product which is gotten in step two is cured and is dried with a UV curing machine to form a conductive adhesive layer 200;

Step four: a protective film 300 is covered on the conductive adhesive layer 200, then a light-heat dual curing anisotropic conductive film is produced in accordance with the present invention;

Step five: the semi-finished product which is gotten in step four is cut roughly and carefully with a slitting machine and then is rolled to get a kind of anisotropic conductive adhesive film (ACF).

Figure 5:
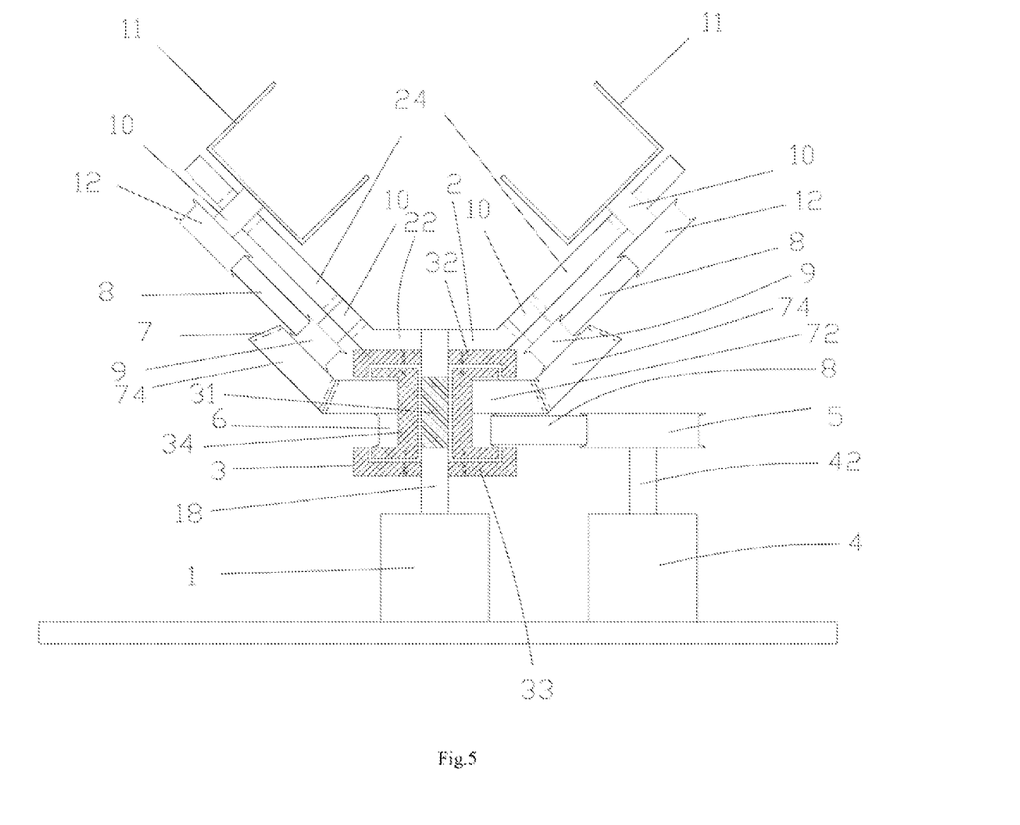
FIG. 5 is a sectional view of the rotation and revolution speed ratio adjustable defoaming-stirring machine in accordance with the present invention.
Figure 6:
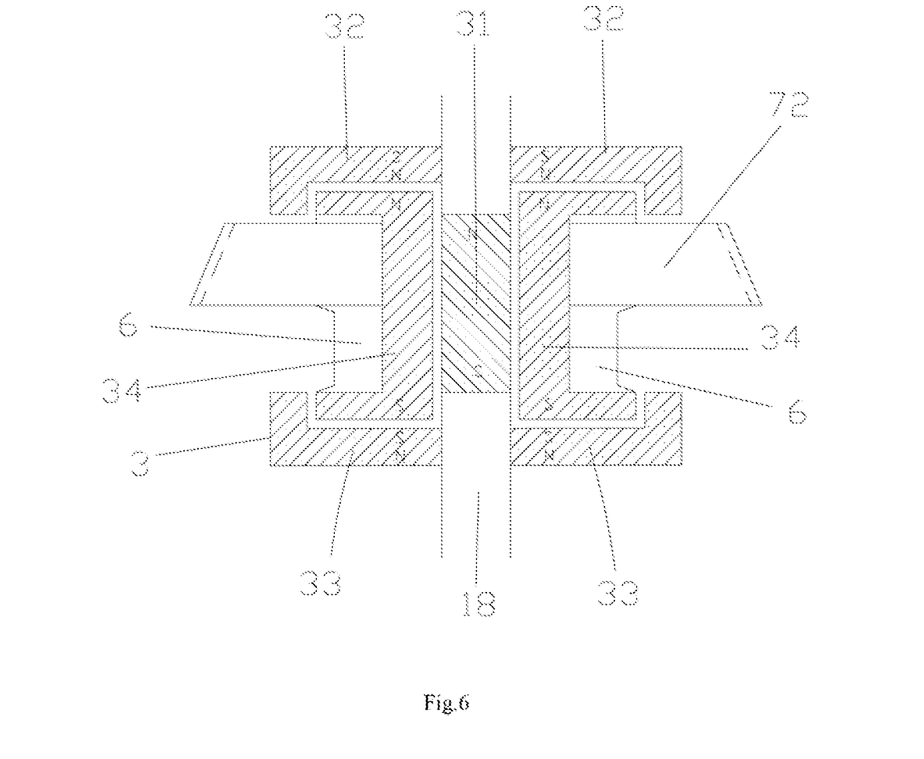
FIG. 6 is a structural view of the rotation and revolution speed ratio adjustable defoaming-stirring machine in accordance with the present invention.

In the above-mentioned step two, as shown in FIG. 5 and FIG. 6, when defoaming the conductive adhesive, a rotation and revolution speed ratio adjustable defoaming-stirring machine is used. The defoaming-stirring machine comprises a first motor 1, a cup sleeve bracket 2, a permanent magnetic levitation bearing 3, a second motor 4, a second motor synchronous wheel 5, a magnetic levitation bearing synchronous wheel 6, a bevel gear 7, three synchronous wheel belts 8, two bevel gear synchronous wheels 9, four bearings 10, two mixing cup sleeves 11, two cup sleeve synchronous wheels 12.

The first motor 1 comprises a rotation shaft 18. When the first motor 1 is turned on, the rotation shaft 18 will rotate.

The cup sleeve bracket 2 is fixed to the distal end of the rotation shaft 18. The cup sleeve bracket 2 comprises a bottom plate 22 and two oblique plates 24. The two oblique plates 24 oblique upper direction extend respectively from the two ends of the bottom plate 22, and there is an angle of 135 degrees between every oblique plate 24 and the bottom plate 22.

The rotation shaft 18 is connected below the bottom plate 22.

When the rotation shaft 18 rotates, the cup sleeve bracket 2 will rotate together.

The permanent magnetic levitation bearing 3 is fixed around the rotation shaft 18. The permanent magnetic levitation bearing 3 comprises a central magnet 31, an upper magnet 32, a lower magnet 33, and a suspended magnet 34.

The central magnet 31 is fixed to the rotation shaft 18. The upper end of the central magnet 31 is N pole, and the lower end of the central magnet 31 is S pole.

The upper magnet 32 is fixed to the base of the bottom plate 22 of the cup sleeve bracket 2. The upper end of the upper magnet 32 is S pole, and the lower end of the upper magnet 32 is N pole.

The lower magnet 33 is sleeved on the rotation shaft 18 and is under the upper magnet 32. The upper end of the lower magnet 33 is S pole, and the lower end of the lower magnet 33 is N pole.

The suspended magnet 34 is sleeved outside of the central magnet 31 and the rotation shaft 18. The suspended magnet 34 is placed between the upper magnet 32 and the lower magnet 33. The suspended magnet 34 does not contact the central magnet 31, the rotation shaft 18, the upper magnet 32 and the lower magnet 33. The upper end of the suspended magnet 34 is N pole, and the lower end of the suspended magnet 34 is S pole.

The upper end of the suspended magnet 34, the upper end of the central magnet 31 and the lower end of the upper magnet 32 are all N poles, and the lower end of the suspended magnet 34, the lower end of the central magnet 31 and the upper end of the lower magnet 33 are all S poles. Because the same poles repel each other, the suspended magnet 34 does not contact the other components and suspends in the air, so the suspended magnet 34 will not receive any friction force when it rotates.

The second motor 4 comprises a rotation shaft 42. When the second motor 4 is turned on, the rotation shaft 42 will rotate.

The second motor synchronous wheel 5 is fixed to the distal end of the rotation shaft 42.

The magnetic levitation bearing synchronous wheel 6 is sleeved on the suspended magnet 34.

The bevel gear 7 comprises a first gear 72 and two second gears 74.

The first gear 72 is sleeved on the suspended magnet 34 and is above the magnetic levitation bearing synchronous wheel 6.

The two second gears 74 are fixed to the two ends of the first gear 72. The first gear 72 can transmit force to the two second gears 74 to make them rotate.

One of the three synchronous wheel belts 8 is fixed between the second motor synchronous wheel 5 and the magnetic levitation bearing synchronous wheel 6.

The two bevel gear synchronous wheels 9 are respectively fixed to the two second gears 74.

The four bearings 10 are respectively fixed to the cup sleeve bracket 2. Two bearings 10 of the above-mentioned four bearings 10 are connected to the two bevel gear synchronous wheels 9.

The two mixing cup sleeves 11 are respectively fixed to the upper ends of the other two bearing 10. So the two mixing cup sleeves 11 can be rotatably fixed to the cup sleeve bracket 2.

The two cup sleeve synchronous wheels 11 are respectively fixed to the lower ends of the other two bearings 10.

The other two synchronous wheel belts 8 are respectively fixed between the two bevel gear synchronous wheels 9 and the two cup sleeve synchronous wheels 12.

When the first motor 1 is turned on, the rotation shaft 18 will rotate to make the cup sleeve bracket 2 rotate synchronously. The two mixing cup sleeves 11 rotate together with the cup sleeve bracket 2, and the rotation shaft 18 is the axis of rotation, so this kind of movement of the two mixing cup sleeves 11 is called "revolution".

When the second motor 4 is turned on, the rotation shaft 42 will rotate. The second motor synchronous wheel 5 rotates to make the magnetic levitation bearing synchronous wheel 6 rotate by the transmission of the synchronous wheel belt 8.

Then, the suspended magnet 34 and the first gear 72 rotate synchronously. The first gear 72 pushes the two second gears 74 to rotate. When the second gears 74 rotates, the two bevel gear synchronous wheels 9 rotate synchronously to make the two cup sleeve synchronous wheels 12 rotate by the transmission of the two synchronous wheel belts 8, then the two mixing cup sleeves 11 rotate. This kind of movement of the two mixing cup sleeves 11 is called "rotation".

Embodiment 1

Weigh the following components according to the lower table.

|  | Components | Content (W %) |
| --- | --- | --- |
| light curing activated monomer | hydroxyethyl methylacrylate | 16.0 |
| light-cured resin | Ethoxylated bisphenol A two methyl acrylate (SR348) | 4.5 |
| thermosetting resin | tetraphenol ethane tetraglycidyl ether epoxy resin (EPON-1301) | 23.5 |
| elastomer | epoxy-terminated nitrile rubber(NBR-1704) | 10.0 |
| plasticizer | polypropylene glycol diglycidyl ether (RF-PPD1217) | 6.0 |
| insulating nanoparticles | nano-SiO2 | 15.0 |
| conductive particles | Conductive gold balls (10 μm) | 4.0 |
| light curing agent | Epoxy group phenyl ethyl copper Irgacure651 | 3.0 |
| latent heat curing agent | modified dicyandiamide (asahi chemical industry AEHD-610) | 16.0 |
| coupling agent | trimethoxy[2-(7-oxabicyclo[4.1.0]hept-3-yl)ethyl]-Silane | 1.0 |
| leveling agent | solydimethyl siloxane | 0.5 |
| antioxidant | 2,6-2 tertiary butyl phenol (T502A) | 0.5 |

Put the solid-state light-cured resin, thermosetting resin and elastomer in a dispersing mixer, then heat them to melt to form a mixture, and the melting temperature is between 130° C. to 150° C.;

Put the liquid-state light curing activated monomer, plasticizer in the above-mentioned mixture, and the temperature is below 80° C.

Put the leveling agent, antioxidant and insulating nanoparticles in the above-mentioned mixture one by one;

Put the conductive particles in the above-mentioned mixture;

Put the light curing agent, latent heat curing agent and coupling agent in the above mixture, then the light-heat dual curing anisotropic conductive adhesive is produced.

Coat the above-mentioned conductive adhesive on a plastic film basic material 100 with a coating machine;

The semi-finished product which is gotten in step two is cured and is dried with a UV curing machine to form a conductive adhesive layer 200;

A protective film 300 is covered on the conductive adhesive layer 200, then a light-heat dual curing anisotropic conductive film is produced in accordance with the present invention.

The conductive film produced by the embodiment has the following physical and chemical parameters.

|  | Items |  | Units | ACF10 | remarks |
| --- | --- | --- | --- | --- | --- |
| standard specifications | The minimum connection circuit | Pitch | μm | 100 |  |
|  |  | Bump space | μm | 50 |  |
|  |  | thickness | μm | 25 |  |
|  |  | width | mm | 1.2, 1.5, 2.0, 3.0 | Other width can be customized |
|  |  | Length | m | 50, 100 |  |
|  |  | color | — | gray |  |
|  |  | Dish heart diameter | mm | 18.5 |  |

-continued

| Items | | Units | ACF10 | remarks |
|---|---|---|---|---|
| | Conductive particles particle size | μm | 10 | polymer microspheres which are plated with Ni/Au |
| | density | Particle number/mm³ | 320k | |
| properties | contact resistance | Ω | ≤5 | All ITO/TCP electrodes, 1.5 mm bonding |
| | insulation resistance | Ω | ≥10⁹ | space length 50 μm, 2.5 mm bonding |
| | peeling strength(20° C.) | kN/m | 1.2 | ITO glasses/ |
| | working range temperature | ° C. | −40-100 | |
| | Electric current | A/mm² | Equal and below 50 | |
| | voltage | V | Equal and below 50 | |
| bonding requirements | Precompression temperature | ° C. | 70-80 | The temperature of ACF when pre-compressing |
| | pressure | MPa | 0.2-0.5 | |
| | time | s | 1-2 | |
| | compression temperature | ° C. | 170-190 | The temperature of ACF when compressing |
| | pressure | MPa | 2-5 | |
| | time | s | 10-20 | |
| storage requirements | sealed package | — | −10-5° C., seven months | |
| | unpackaged | — | 25° C., below 70% RH, one month | |

Embodiment 2

Weigh the following components according to the lower table.

| | Components | Content (W %) |
|---|---|---|
| light curing activated monomer | 2-dimethyl propyl ester two acrylate, | 18.0 |
| light-cured resin | Two shrinkage three glycol dimethyl acrylate (SR205) | 9.5 |
| thermosetting resin | tetraphenol ethane tetraglycidyl ether epoxy resin (EPON-1301) | 20.0 |
| elastomer | Epoxy acrylate rubber (ACM62) | 5.0 |
| plasticizer | polypropylene glycol diglycidyl ether RF-PPD1217 | 3.0 |
| insulating nanoparticles | nano-$CaCO_3$ | 8.0 |
| conductive particles | conductive gold balls(4 μm) | 18.0 |
| light curing agent | DMPA Irgacure651 | 4.0 |
| latent heat curing agent | Huntsman product DY9577 | 12.0 |
| coupling agent | trimethoxy[2-(7-oxabicyclo[4.1.0]hept-3-yl)ethyl]-Silane | 0.5 |
| leveling agent | Polyphenylmethylsiloxane | 1.0 |
| antioxidant | nonyl-n-benzenamin KT5535 | 1.0 |

Put the solid-state light-cured resin, thermosetting resin and elastomer in a dispersing mixer, then heat them to melt to form a mixture, and the melting temperature is between 130° C. to 150° C.;

Put the liquid-state light curing activated monomer and plasticizer in the above-mentioned mixture, and the temperature is below 80° C.;

Put the leveling agent, antioxidant and insulating nanoparticles in the above-mentioned mixture one by one;

Put the conductive particles in the above-mentioned mixture;

Put the light curing agent, latent heat curing agent and coupling agent in the above mixture, then the light-heat dual curing anisotropic conductive adhesive is produced.

Coat the above-mentioned conductive adhesive on a plastic film basic material 100 with a coating machine;

The semi-finished product which is gotten in step two is cured and is dried with a UV curing machine to form a conductive adhesive layer 200;

A protective film 300 is covered on the conductive adhesive layer 200, then a light-heat dual curing anisotropic conductive film is produced in accordance with the present invention.

The conductive film produced by the embodiment has the following physical and chemical parameters.

| | Items | | Units | ACF04 | remarks |
|---|---|---|---|---|---|
| standard specifications | The minimum connection circuit | Pitch | μm | 50 | |
| | | Bump space | μm | 20 | |
| | | thickness | μm | 20 | |
| | | width | mm | 1.2, 1.5, 2.0, 3.0 | Other width can be customized |
| | | Length | m | 50, 100 | |
| | | color | — | gray | |
| | Dish heart diameter | | mm | 18.5 | |
| | Conductive particles | particle size | μm | 4 | polymer microspheres which are plated with Ni/Au |
| | | density | Particle number/mm³ | 480k | |

-continued

| Items | | Units | ACF04 | remarks |
|---|---|---|---|---|
| properties | contact resistance | Ω | ≤5 | All ITO/TCP electrodes, 1.5 mm bonding space length 50 μm, 2.5 mm bonding |
| | insulation resistance | Ω | ≥10³ | |
| | peeling strength(20° C.) | kN/m | 1.2 | ITO glasses/FPC |
| working range | temperature | ° C. | −40-100 | |
| | Electric current | A/mm² | Equal and below 50 | |
| | voltage | V | Equal and below 50 | |
| bonding requirements | Pre-compression temperature | ° C. | 70 ± 10 | The temperature of ACF when pre-compressing |
| | pressure | MPa | 1-2 | |
| | time | s | 2-4 | |
| | compression temperature | ° C. | 180 ± 10    190 ± 10 | The temperature of ACF when compressing |
| | pressure | MPa | 2-3    2-3 | |
| | time | s | 15    10 | |
| storage requirements | sealed package | — | −10-5° C., seven months | |
| | unpackaged | — | 25° C., below 70% RH, one month | |

Embodiment 3

Weigh the following components according to the lower table.

| Components | | Content (W %) |
|---|---|---|
| light curing activated monomer | Lauric acid (meth) acrylate | 16.0 |
| light-cured resin | Polyurethane acrylic resin BK-2308 | 4.5 |
| thermosetting resin | P-aminophenol three glycidyl epoxy resin | 23.5 |
| elastomer | hydroxyl-terminated NBR CTBN1300X18 | 10.0 |
| plasticizer | polypropylene glycol diglycidyl ether | 6.0 |
| insulating nanoparticles | Nano-ceramic powder | 15.0 |
| conductive particles | Conductive gold balls (9 μm) | 4.0 |
| light curing agent | HCPK Irgacure184 | 3.0 |
| latent heat curing agent | modified dicyandiamide (Aradur2844) | 16.0 |
| coupling agent | γ-methacryloxypropyltrimethoxysilane | 1.0 |
| leveling agent | polymethylphenyl silicone | 0.5 |
| antioxidant | 4,4-methylene (2,6-2 tertiary butyl phenol) T511 | 0.5 |

Put the solid-state light-cured resin, thermosetting resin and elastomer in a dispersing mixer, then heat them to melt to form a mixture, and the melting temperature is between 130° C. to 150° C.;

Put the liquid-state light curing activated monomer and plasticizer in the above-mentioned mixture, and the temperature is below 80° C.;

Put the leveling agent, antioxidant and insulating nanoparticles in the above-mentioned mixture one by one;

Put the conductive particles in the above-mentioned mixture;

Put the light curing agent, latent heat curing agent, coupling agent in the above mixture, then the light-heat dual curing anisotropic conductive adhesive is produced.

Coat the above-mentioned conductive adhesive on a plastic film basic material 100 with a coating machine;

The semi-finished product which is gotten in step two is cured and is dried with a UV curing machine to form a conductive adhesive layer 200;

A protective film 300 is covered on the conductive adhesive layer 200 then a light-heat dual curing anisotropic conductive film is produced in accordance with the present invention.

The conductive film produced by the embodiment has the following physical and chemical parameters.

| | Items | | Units | ACF09 | remarks |
|---|---|---|---|---|---|
| standard specifications | The minimum connection circuit | Pitch | μm | 100 | |
| | | Bump space | μm | 50 | |
| | | thickness | μm | 25 | |
| | | width | mm | 1.2, 1.5, 2.0, 3.0 | Other width can be customized |
| | | Length | m | 50, 100 | |
| | | color | — | gray | |
| | | Dish, heart diameter | mm | 18.5 | |
| | Conductive particles | particle size | μm | 9 | polymer microspheres which are plated with Ni/Au |
| | | density | Particle number/mm³ | 170k | |
| properties | | contact resistance | Ω | ≤5 | All ITO/TCP electrodes, 1.5 mm bonding |

| Items | | | Units | ACF09 | remarks |
|---|---|---|---|---|---|
| | | insulation resistance | Ω | ≥10⁹ | space length 50 μm, 2.5 mm bonding |
| | | peeling strength(20° C.) | kN/m | 1.2 | ITO glasses/ |
| | working range | temperature | ° C. | −40-100 | |
| | | Electric current | A/mm² | Equal and below 50 | |
| | | voltage | V | Equal and below 50 | |
| bonding requirements | Precompression | temperature | ° C. | 70-80 | The temperature of ACF when pre-compressing |
| | | pressure | MPa | 0.2-0.5 | |
| | | time | s | 1-2 | |
| | compression | temperature | ° C. | 170-190 | The temperature of ACF when compressing |
| | | pressure | MPa | 2-5 | |
| | | time | s | 10-20 | |
| storage requirements | | sealed package | — | −10-5° C., seven months | |
| | | unpackaged | — | 25° C., below 70% RH, one month | |

What is claimed is:

1. A preparation method of an anisotropic conductive adhesive film comprising a plastic film base material and a conductive adhesive layer produced by coating a light-heat dual curing anisotropic conductive adhesive on the plastic film base material and curing the coating with ultraviolet light to form said conductive adhesive layer; said light-heat dual curing anisotropic conductive adhesive consisting of light curing active monomer 15.0-18.0%, light-curing resin 4.5-12.5%, thermosetting resin 20.0-25.0%, elastomer 5.0-10.0%, plasticizer 3.0-6.0%, insulating nanoparticles 8.0-15.0%, conductive particles 4.0-18.0%, light curing agent 3.0-5.0%, latent heat curing agent 12.0-16.0%, coupling agent 0.5-1.0%, leveling agent 0.5-1.5% and antioxidant 0.5-1.0%, wherein the above-mentioned components are calculated according to weight percentage, the method comprising the following steps:
  1) putting a solid-state light-curing resin, a solid-state thermosetting resin and a solid-state elastomer in a dispersing mixer, then heating them to temperature between 130° C. to 150° C. to melt and form a mixture;
  2) adding a liquid-state light curing active monomer and plasticizer to the above-mentioned mixture that has been cooled to the temperature below 80° C.;
  3) adding separately the leveling agent, antioxidant and insulating nanoparticles to the mixture;
  4) adding conductive particles to the mixture;
  5) adding a light curing agent, latent heat curing agent and coupling agent to the mixture, so that a light-heat dual curing anisotropic conductive adhesive is produced;
  6) coating the conductive adhesive on a plastic film base material with a coating machine thereby forming a semi-finished product;
  7) curing and drying the semi-finished product with a UV curing machine to form a cured conductive adhesive layer, so that an anisotropic conductive adhesive film is produced;
  8) cutting with a slitting machine through the anisotropic conductive adhesive layer without cutting the plastic film base material, and then rolling the anisotropic conductive adhesive film,
  wherein steps 1 to 7 are preformed without using a solvent.

2. A preparation method of an anisotropic conductive adhesive film comprising a plastic film base material and a conductive adhesive layer produced by coating a light-heat dual curing anisotropic conductive adhesive on the plastic film base material and curing the coating with ultraviolet light to form said conductive adhesive layer; said light-heat dual curing anisotropic conductive adhesive consisting of light curing active monomer 15.0-18.0%, light-curing resin 4.5-12.5%, thermosetting resin 20.0-25.0%, elastomer 5.0-10.0%, plasticizer 3.0-6.0%, insulating nanoparticles 8.0-15.0%, conductive particles 4.0-18.0%, light curing agent 3.0-5.0%, latent heat curing agent 12.0-16.0%, coupling agent 0.5-1.0%, leveling agent 0.5-1.5% and antioxidant 0.5-1.0%, wherein the above-mentioned components are calculated according to weight percentage, and wherein the conductive adhesive film further comprises a protective film that covers the conductive adhesive layer, the method comprising the following steps:
  1) putting a solid-state light-curing resin, a solid-state thermosetting resin and a solid-state elastomer in a dispersing mixer, then heating them to temperature between 130° C. to 150° C. to melt and form a mixture,
  2) adding a liquid-state light curing active monomer and plasticizer to the above-mentioned mixture that has been cooled to the temperature below 80° C.;
  3) adding separately the leveling agent, antioxidant and insulating nanoparticles to the mixture;
  4) adding conductive particles to the mixture;
  5) adding a light curing agent, latent heat curing agent and coupling agent to the mixture, so that a light-heat dual curing anisotropic conductive adhesive is produced;
  6) coating the conductive adhesive on a plastic film base material with a coating machine thereby forming a semi-finished product;
  7) curing and drying the semi-finished product with a UV curing machine to form a cured conductive adhesive layer;
  8) covering the cured conductive adhesive layer with a protective film, so that an anisotropic conductive adhesive film is produced;
  9) cutting with a slitting machine through the anisotropic conductive adhesive layer without cutting the plastic film base material; and then rolling the anisotropic conductive adhesive film,
  wherein steps 1 to 7 are performed without using a solvent.

* * * * *